United States Patent
Cline et al.

(10) Patent No.: US 6,424,567 B1
(45) Date of Patent: Jul. 23, 2002

(54) FAST RECONFIGURABLE PROGRAMMABLE DEVICE

(75) Inventors: Ronald L. Cline, Albuquerque, NM (US); Bernardo De Oliveira Kastrup Pereira, Eindhoven (NL)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/348,961

(22) Filed: Jul. 7, 1999

(51) Int. Cl.[7] .............................. G11C 16/04; G06F 7/38
(52) U.S. Cl. ..................................... 365/185.04; 326/37
(58) Field of Search ....................... 365/230.03, 189.05, 365/230.08, 185.04, 185.11; 326/37

(56) References Cited

U.S. PATENT DOCUMENTS

| | | | |
|---|---|---|---|
| RE34,363 E | 8/1993 | Freeman | 326/41 |
| 5,260,610 A | 11/1993 | Pedersen et al. | 326/41 |
| 5,260,611 A | 11/1993 | Cliff et al. | 326/41 |
| 5,450,360 A | * 9/1995 | Sato | 365/185.11 |
| 5,469,003 A | 11/1995 | Kean | 329/39 |
| 5,550,782 A | 8/1996 | Cliff et al. | 365/230.03 |
| 5,680,363 A | * 10/1997 | Dosaka et al. | 365/230.03 |
| 5,757,207 A | 5/1998 | Lytle et al. | 326/39 |
| 5,761,099 A | 6/1998 | Pedersen | 326/41 |
| 5,778,439 A | 7/1998 | Trimberger et al. | 711/153 |
| 5,809,257 A | * 9/1998 | Shibazaki | 365/189.05 |

FOREIGN PATENT DOCUMENTS

WO    WO9714220    10/1996

* cited by examiner

*Primary Examiner*—Trong Phan

(57) ABSTRACT

A programmable cell comprises an externally loadable electrically erasable (EE) transistor cell that is configured to be independent of the currently active state of the programmed cell. When all of the EE cells are loaded with a new configuration, the contents of all of the EE cells are loaded into the corresponding programmable cells, preferably within one clock cycle. Because the entirety of the programmable cells can be pre-loaded with the new configuration, the time to effect a reconfiguration is one clock cycle. Because an EE cell is significantly smaller than a conventional four to six transistor storage cell, the area required to implement this single-clock-cycle reconfiguration capability is substantially less than traditional dynamically reprogrammable memory configurations. In an alternative embodiment, multiple EE cells can be associated with each programmable cell, thereby allowing a multiple-configuration capability.

9 Claims, 3 Drawing Sheets

FAST RECONFIGURABLE PROGRAMMABLE DEVICE

BACKGROUND OF THE INVENTION

1. Field of the Invention

This invention relates to the field of integrated circuit design, and in particular to programmable devices.

2. Description of Related Art

Programmable integrated circuits are common in the art, wherein the operation of the circuit is based on the contents of memory cells. Typically, the programming comprises a sequence of instructions, or a set of data, or a combination of both. The instructions may be, for example, object code for an embedded processor, and the data may be, for example, the values for a look-up table in a programmable logic device, or, the desired state of switch elements in a field-programmable gate array, and so on. For ease of reference, the terms "program", "program data" and "code" as used herein includes instructions and data, and any combination thereof.

The program is typically "downloaded" from a programming device, such as a desktop computer. The programming device asserts a control signal to place the programmable device into a reception mode, and communicates the content of the program as a sequence of location/code pairs. The location identifies the individual programmable element within the programming device that is being programmed, and the code identifies the value that the programmable element receives. In the reception mode, the programmable device places the received code at the specified location. In some devices, the location argument can be implicit: upon receipt of the control signal, the programmable device places the code at a default start location, and at sequential locations thereafter.

Depending upon the architecture of the programmable device, the reprogramming of the programmable device can be incremental, allowing for select locations to be reprogrammed, or total, requiring all locations to be reprogrammed. In most cases, additional information is also provided to facilitate the programming or reprogramming, such as checksums, error correcting sums, and so on. These and other programming techniques are common in the art.

The downloading of a program onto a programmable device typically renders the device inoperative while the program is being downloaded. A variety of techniques are available to minimize the inoperative time associated with the download of the program. The device and program may be partitioned into independent blocks, and the individual device blocks are loaded by the corresponding program block while that device block is not being utilized. This approach requires safeguards to assure that conflicts between the prior program and the new program do not arise among related blocks. An alternative approach is to provide multiple "planes" of programmable elements within the system. In this approach, for example, a select-bit is used to select one of two planes of memory as an "active" plane for system operation, the other plane being inactive, from the system's perspective. Programming is effected by loading the inactive plane, then toggling the select-bit, making the newly programmed plane the currently active plane. The use of two programmable planes, however, effectively doubles the size of the area consumed by the programmable elements in the design. U.S. Pat. No. 5,778,439 discloses the use of multiple storage cells per memory element. In the referenced patent, incorporated herein by reference, one of the cells in each memory element is designated as an active storage, and the remaining cells (nominally 7) are inactive storage elements. Each of the inactive storage elements form a "virtual" memory, that can be dynamically designated as the active storage, replacing the currently active storage. Each storage cell of each memory device in the referenced patent, however, comprises four to six transistors, thereby substantially increasing the size of the area consumed by these virtual memory device. Hybrid approaches are also viable. For example, buffering can be provided within the programmable device to minimize the effects of the relatively slow process of transferring the program from an external programming device by delaying the commencement of the actual programming of the programmable elements until a significant portion of the program is received. Because an internal transfer of the program can be effected more efficiently than a transfer from an external source, this buffering approach significantly reduces the overall inoperable duration, but a significant amount of buffering, and corresponding circuit area, must be provided to realize this gain.

BRIEF SUMMARY OF THE INVENTION

It is an object of this invention to provide a programmable logic device that can be programmed, and reprogrammed, quickly. It is a further object of this invention to provide a programmable logic device that can be reprogrammed quickly that consumes minimal additional circuitry and circuitry area. It is a further object of this invention to provide an area efficient architecture for multi-plane programming applications.

These objects and others are achieved by providing a programmable cell having an externally loadable electrically erasable (EE) transistor cell that is configured to be independent of the currently active state of the programmed cell. When all of the EE cells are loaded with a new configuration, the contents of all of the EE cells are loaded into the corresponding programmable cells, preferably within one clock cycle. Because the entirety of the programmable cells can be pre-loaded with the new configuration, the time to effect a reconfiguration is one clock cycle. Because an EE cell is significantly smaller than a conventional four to six transistor storage cell, the area required to implement this single-clock-cycle reconfiguration capability is substantially less than traditional dynamically reprogrammable device configurations. In an alternative embodiment, multiple EE cells can be associated with each programmable cell, thereby allowing a multiple-configuration capability.

BRIEF DESCRIPTION OF THE DRAWINGS

The invention is explained in further detail, and by way of example, with reference to the accompanying drawings wherein.

Throughout the drawings, same reference numerals indicate similar or corresponding features or functions.

DETAILED DESCRIPTION OF THE INVENTION

Figure 1:
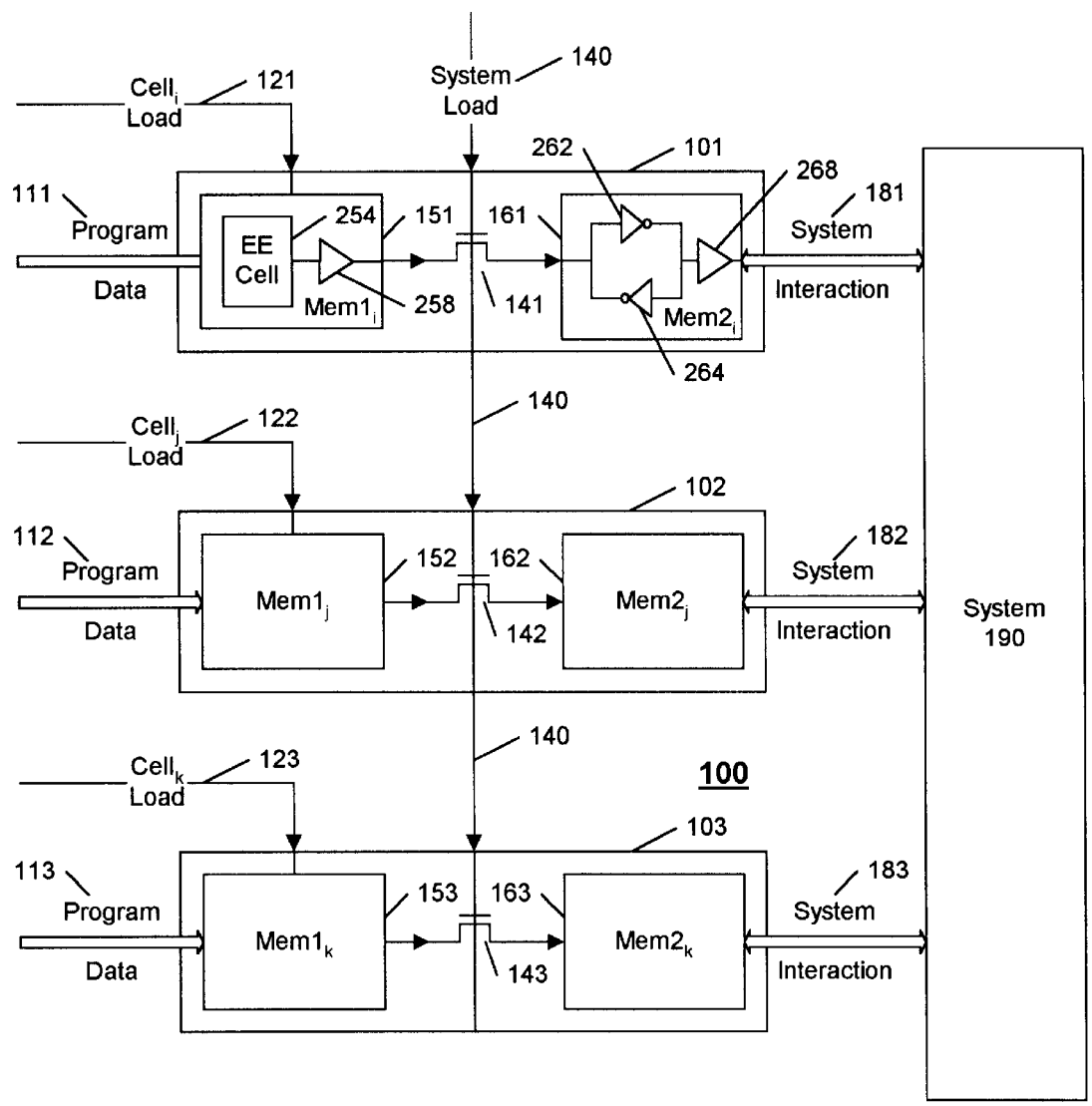
FIG. 1 illustrates an example block diagram of a programmable device containing programmable cells in accordance with this invention.

FIG. 1 illustrates an example block diagram of a programmable device 100 containing programmable cells 101–103 in accordance with this invention. The programmable device 100 includes a system 190 of logic that performs a function and produces an output in dependence upon the contents of the programmable cells 101–103. Although only three programmable cells 101–103 are illustrated in FIG. 1, for ease of understanding, the principles of this invention are scalable to arbitrarily larger quantities of programmable cells.

Each programmable cell 101–103 includes a first memory element 151–153, a transfer gate 141–143, and a second memory element 161–163. The first memory elements 151–153 receive program data 111–113 from an external source (not shown). The transfer gates 141–143 isolate the first memory elements 151–153 from the second memory elements 161–163, respectively, until the system load signal 140 is asserted. In accordance with this invention, the first memory elements 151–153 comprise a electrically erasable (EE) transistor cell 254, which is significantly smaller in area than a conventional four to six transistor RAM cell. As would be evident to one of ordinary skill in the art, EE cells are substantially slower than conventional RAM cells, requiring a longer time to store a new logic value, and a longer time to retrieve that value. This invention is premised on the observation that if the first memory elements 151–153 are used for relatively infrequent reconfiguration tasks, the slow speed of access of an EE device can be tolerated, in return for a significant reduction of circuit area.

The program data 111–113 is provided to the first memory element by selectively loading 121–123 each first memory element 151–153 when the appropriate program data value 111–113 is provided to each cell. As discussed above with regard to conventional programmable devices, the loading of each cell is typically effected via a sequential load of the program data. In a preferred embodiment, the program data is provided on a single bus to all cells, and loaded to the individual cells using a location address associated with each cell 101–103 to selectively assert each cell load signal 121–123 when the program data corresponds to that cell.

After all of the first memory elements 151–153 of each programmable cell 101–103 are loaded with the program data 111–113, the contents of each of the first memory elements 151–153 are transferred to the second memory elements 161–163 via the transfer gate 141–143 of each programmable cell 101–103. As illustrated in FIG. 1, the transfer gates 141–143 have a common control signal, the system load signal 140. When the system load signal 140 is asserted, the contents of all of the first memory elements 151–153 are simultaneously transferred to all of the second memory elements 161–163.

The system 190 interacts exclusively with the second memory elements 161–163. Thus, immediately after the system load signal 140 is asserted, and the program data is transferred from the first memory elements 151–153 to the second memory elements 161–163, the system 190 will operate in accordance with the newly loaded program data 111–113. In a preferred embodiment, the system load 140 is asserted in synchronization with a master clock signal having a period that is sufficiently long to allow the transfer of the program data from the first memory elements 151–153 to the second memory elements 161–163. In a preferred embodiment, the system 190 is placed into an inoperative state for a single clock cycle while the system load 140 is asserted. Thereafter, the system 190 interacts in dependence upon the newly loaded program data 111–113 in the second memory elements 161–163, via the outputs 181–183 of each cell 101–103.

When the system load 140 is de-asserted, the second memory elements 161–163 are isolated from the first memory elements 151–153, thereby allowing the first memory elements 151–153 to be reloaded with new program data 111–113 without affecting the operation of the system 190. When all of the first memory elements 151–153 contain the new program data 111–113, and the system 190 is placed in an inoperative mode, the system load 140 is asserted, as discussed above, to load the second memory elements 161–163 with the new program data 111–113 that is contained in the first memory elements 151–153.

Thus, in accordance with this invention, the programmable device 100 can be reconfigured from one program to another program within a single clock cycle, regardless of the size of the program, and regardless of the time required to load the program data into the first memory elements 151–153.

Because the first memory elements 151–153 need only transfer a logic value to the second memory elements 161–163, the first memory elements 151–153 can be minimally sized, compared to the second memory elements 161–163 that may have loading demands and speed requirements that require larger sized components. A sense amplifier 258 is used to provide the current required to effect the transfer of the state of the EE cell 254 to the corresponding second memory elements 161–163. The electrically erasable transistor comprising the EE cell 254 is loaded with the program data 110 upon assertion of the cell load signal 121.

The second memory elements 161–163 of each of the programmable cells 101–103 comprise two inverters 262, 264 that are configured as a conventional static latch, as typically used in an SRAM device. When the transfer gates 141–143 are in a conductive state, the corresponding sense amplifiers 258 provide sufficient current to drive the corresponding inverters 262 to the appropriate state, and the inverters 264 maintain that state after the transfer gates 141–143 isolate the sense amplifiers 258 from the inverters 262. Drivers 268 transfer this stored state to the cell outputs 181–183. Alternative memory devices may be used for the second memory elements 161–163, including dynamic latches and the like.

Figure 2:
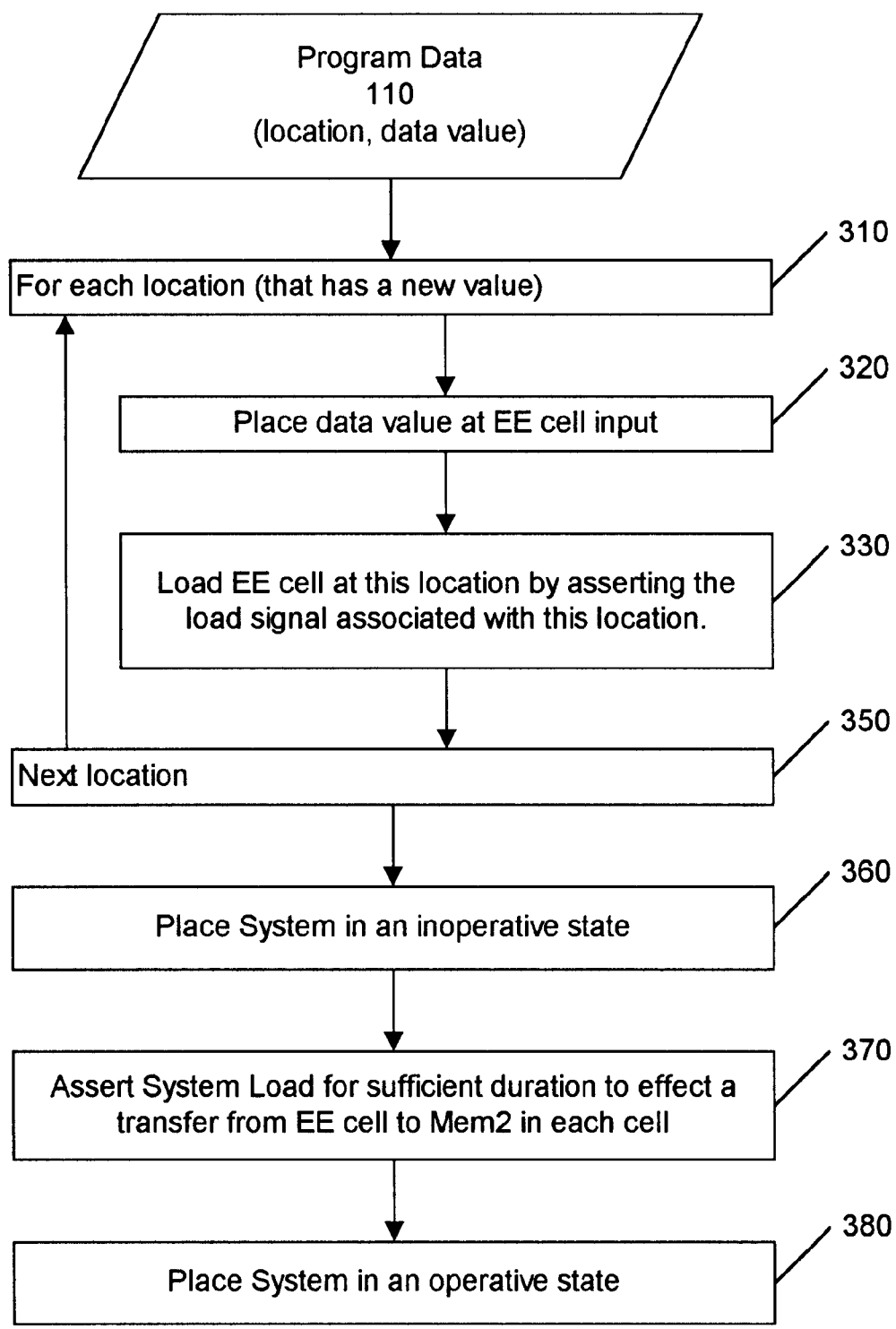
FIG. 2 illustrates an example flow diagram for programming a programmable device in accordance with this invention.

FIG. 2 illustrates an example flow diagram for programming a programmable device in accordance with this invention. The loop 310–350 effects the loading of the program data into the first memory elements of each programmable cell in the programmable device, based on the set of location/data pairs in the program data set 110. As in a conventional programmable device, only the programmable cells that have a different value from their current value need be changed, but the explicit loading of all cells is often the simpler process. In a preferred embodiment, the data is placed at the input of all the cells, at 320, and the cell that is identified by the program data location parameter is loaded, at 330.

After all of the programmable cells are loaded with their appropriate logic values, the system is placed in an inoperative mode, at 360, and the system load signal is asserted, at 370, and held in that state for a sufficient duration to transfer the contents of all of the first memory elements to the second memory elements, typically one clock cycle. At 380, the system is placed back into an operative mode, and resumes operation in accordance with the newly loaded program.

The foregoing merely illustrates the principles of the invention. It will thus be appreciated that those skilled in the art will be able to devise various arrangements which, although not explicitly described or shown herein, embody the principles of the invention and are thus within its spirit and scope. For example, FIG. 3 illustrates an example block diagram of an alternative programmable cell 400, as may be used for each of the programmable cells 101–103 in FIG. 1 to allow for the storage of multiple alternative programs.

Figure 3:
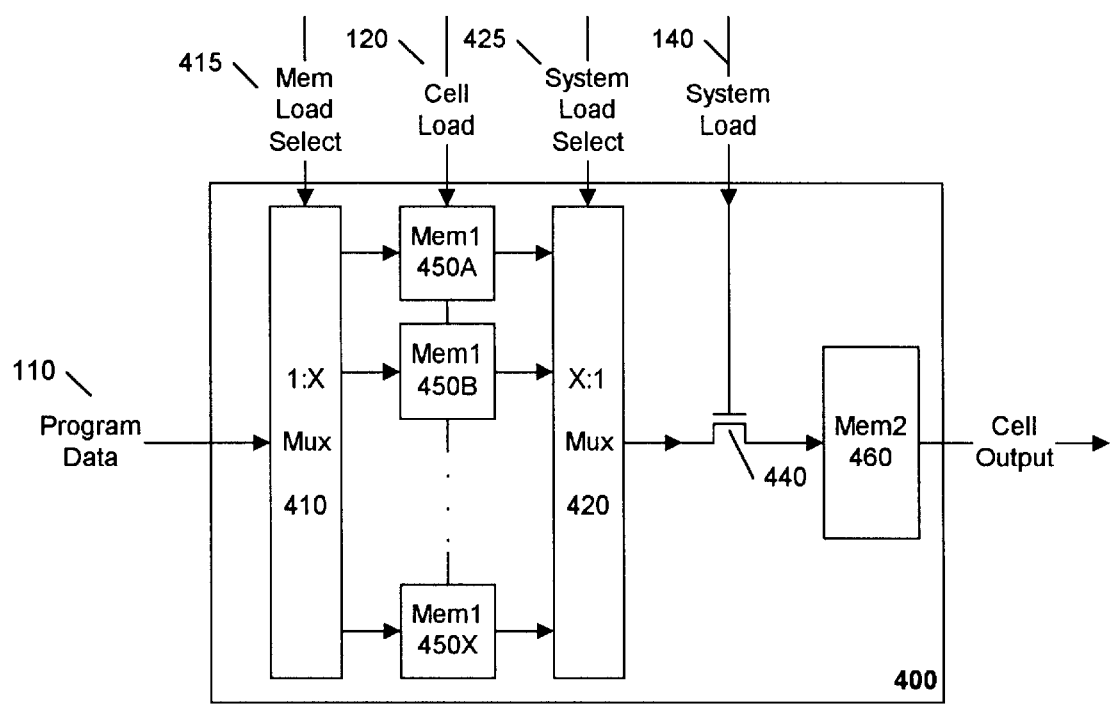
FIG. 3 illustrates an example block diagram of an alternative programmable cell in accordance with this invention.

As illustrated in FIG. 3, a first multiplexer 410 selects which memory element 450A, 450B, . . . 450X receives the current program data 110. In accordance with this invention, each memory element 450A, 450B, . . . is an EE cell, as discussed above. In a preferred embodiment of a programmable device 100, each first multiplexer of the programmable cells 400 is controlled by the same memory-load-select signal 415, so that one program can be loaded into memory element 450A of each cell 400 when the load-select 415 is in a first state, another program can be loaded into memory element 450B of each cell 400 when the load-select 415 is in a second state, and so on. A second multiplexer 420 selects, via a system-load-select signal 425, which memory element 450A, 450B, . . . 450X is loaded into the second-stage memory element 460 when the system load signal 140 is asserted to the transfer gate 440, corresponding to the transfer gates 141–143 of FIG. 1. The system-load-select signal 425 in a preferred embodiment is also commonly connected to all cells 400.

The configuration of FIG. 3 is particularly well suited for applications wherein the programmable device 100 performs a sequence of functions, each function being effected via a program that is loaded in each set of memory elements 450A, 450B, . . . 450X.

Note that not every programmable element in a programmable device 100 need be a multi-memory programmable cell 101–103. For example, a programmable device 100 may be a processing chip that includes a program segment and a data segment of programmable elements. In such an application, as discussed above, the need for a rapid access to the program segment may not exist, but a rapid access to update and retrieve data within the data segment may be required. In such an embodiment, the data segment may comprise conventional prior-art multi-state memory cells, while the program segment, may comprise the smaller, albeit slower, EE cell based memory cells in accordance with this invention. Other memory elements may be conventional single-state memory cells. In like manner, some of the programmable elements of the programmable device may be the multi-state programmable cells 400 in accordance with this invention.

The structure and architecture presented in the figures are presented for illustration purposes, and alternative embodiments will be evident to one of ordinary skill in the art in view of this invention. For example, although the programmable cells 101–103, 400 are presented as single logic entities in the illustrations, the individual components of the cells 101–103, 400 may be physically distinct from each other. For ease of layout, manufacture, or testing, for example, all of the EE cells 254 may be located in a contiguous area, and the second memory elements 161–163 distributed throughout the device 100; or, some programmable cells may be physically integrated, while others have physically partitioned components; and so on.

Note also that, depending upon the particular design criteria for the programmable device 100, other optimizations may also be employed. For example, the function of the transfer gate 440 in FIG. 3 can be integrated into the second multiplexer 420, wherein the system load select signal 425 includes a "select none" mode that isolates all of the first memory elements 450A–450X from the second memory element 460, and effects a transfer to the second memory element 460 when one of the first memory elements 450A–450X are selected.

In like manner, although the system load 140 is preferably asserted in synchronization with a master clock, while the system 190 is in an inoperative state, an asynchronous system load, while the system 190 is operative, can be effected, provided that the potential anomalies caused during the transition from one program to another are determined to be acceptable. Similarly, although the system load 140 is presented as the sole means for programming the second memory element 161–163, 460, the second memory element 161–163, 460 may also be programmed via the system 190. That is, the second memory element 161–163, 460 may operate as a conventional two-port RAM, with input from either the first memory elements 151–153, 450A–450X, or from the system 190, via 181–183. In such an embodiment, the entire contents of the RAM can be replaced within one clock cycle, then subsequently processed and updated by the system 190 while new data is being loaded into the first memory elements 151–153, 450A–450X.

These and other configuration and operation modifications will be evident to one of ordinary skill in the art in view of this invention, and are included within the scope of the following claims.

We claim:

1. A programmable device, comprising:
   a plurality of programmable cells, each programmable cell of said plurality of programmable cells including
   a first memory element including an electrically erasable transistor that is configured to receive a first logic value from an external source to form a first stored logic value,
   a second memory element coupled that is configured to receive the first stored logic value from the first memory element to form a second stored logic value, and
   a transfer device, operably coupled to the first memory element and the second memory element, having a control input that is common to the plurality of programmable cells that effects a transfer of the first stored logic value to the second memory element; and
   a system, operably coupled to said plurality of programmable cells, having an output that depends upon the second stored logic value, wherein said system is inoperative during a reception of the first stored logic value by the second memory element.

2. The programmable device of claim 1, wherein:
   the second memory element includes a latch.

3. The programmable device of claim 1, wherein:
   the control input has a first state and a second state, and
   the transfer device effects the transfer of the first stored logic value to the second memory element when the control input is in the first state, and
   the first memory element forms the first stored logic value when the control input is in the second state.

4. The programmable device of claim 1, wherein each programmable cell further comprises:
   at least one other electrically erasable transistor that is configured to receive an other logic value from the external source to form an other stored logic value, and
   a multiplexer operably coupled to the at least one other electrically erasable transistor, the first memory element, and the transfer device, that is configured to communicate one of the first stored logic value and the other stored logic value to the transfer device for transfer to the second memory element to effect a new second stored logic value.

5. The programmable device of claim 4, wherein the multiplexer includes the transfer device.

6. A programmable device, comprising:

a programmable cell including a first memory element operable to store a logic value, a second memory element operable to store the logic value, and a transfer device operable to transfer the logic value from the first memory element to the second memory element in response to a reception of a system load signal; and a system operable to provide an output as a function of the logic value, wherein said system receives the logic value from the second memory element after a completion of a transfer by the transfer device of the logic value from the first memory element to the second memory element.

7. A method of programming a programmable device including a first memory element, a second memory element and a system, said method comprising:

loading a first program data into the first memory element;

transferring the first program data from the first memory element to the second memory element; and transferring the first program data from the second memory element to the system after a completion of a transfer of the first program data from the first memory element to the second memory element.

8. The method of claim 7, further comprising:

loading a second program data into the first memory element during a transfer of the first program data from the second memory element to the system.

9. The method of claim 8, further comprising:

transferring the second program data from the first memory element to the second memory element; and transferring the second program data from the second memory element to the system after a completion of a transfer of the second program data from the first memory element to the second memory element.

* * * * *